(12) United States Patent
Robison et al.

(10) Patent No.: US 8,836,430 B1
(45) Date of Patent: Sep. 16, 2014

(54) WIDEBAND DISTRIBUTED AMPLIFIER WITH INTEGRAL BYPASS

(71) Applicant: Harris Corporation, Melbourne, FL (US)

(72) Inventors: Daniel A. Robison, Palm Bay, FL (US); Ronald J. Hash, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 59 days.

(21) Appl. No.: 13/783,555

(22) Filed: Mar. 4, 2013

(51) Int. Cl.
  *H03F 3/60* (2006.01)
  *H03F 3/68* (2006.01)
  *H03F 3/195* (2006.01)

(52) U.S. Cl.
  CPC ........................................ *H03F 3/195* (2013.01)
  USPC ............................................ 330/286; 330/295

(58) Field of Classification Search
  USPC ................... 330/295, 124 R, 84, 286, 53–54
  See application file for complete search history.

(56) References Cited

U.S. PATENT DOCUMENTS 2,958,046 A   10/1960  Walters
8,442,465 B2 *  5/2013  Leverich ................... 455/245.2

* cited by examiner

*Primary Examiner* — Hieu Nguyen
(74) *Attorney, Agent, or Firm* — Fox Rothschild LLP; Robert J. Sacco

(57) ABSTRACT

An improved distributed amplifier (200) includes an input transmission line (201) terminated with an input lead configured to accept an input signal and an output transmission line (202) terminated with an output lead configured to output an output signal. A number of parallel amplifier cells ($204_N$) are connected to the input transmission line (201) and the output transmission line (202) that collectively amplify the input signal from the input lead to produce an amplified output signal at the output lead. A bypass switch (212, 300) is connected to the input and output transmission lines (201, 202). The bypass switch (212, 300) is operative to convert either the input transmission line (201, 301) or the output transmission line (202, 302) into a bypass line configured to bypass the parallel amplifier cells ($204_N$) of the distributed amplifier (200) and provide a direct path between the input and output transmission lines (201, 202) to produce a bypassed output signal at the output lead.

15 Claims, 6 Drawing Sheets

US 8,836,430 B1

WIDEBAND DISTRIBUTED AMPLIFIER WITH INTEGRAL BYPASS

BACKGROUND OF THE INVENTION

1. Statement of the Technical Field

The invention concerns gain control in wideband distributed amplifiers. More specifically, the invention relates to an integrated high isolation bypass circuit suitable for use in monolithic microwave integrated circuits.

2. Description of the Related Art

Wideband distributed amplifiers have seen substantial use in high bandwidth electronic communications. Distributed amplifiers are circuit designs that leverage the impedances of a transmission line coupled with the intrinsic impedances of active field effect transistor (FET) cells to obtain a larger gain bandwidth than is possible using conventional amplifiers. As an input signal propagates along an input transmission line, active amplifier cells that connect the input line to the output induce an amplified, complimentary signal in the output transmission line. In an ideal distributed amplifier the gain of the amplified signal is determined by the transconductance and bias point of a single active FET cell, but also has a linear dependence on the number of active FET cells in the distributed amplifier. In practical circuits, this is limited by parasitic reactances and resistances of the FET cells and attached circuitry.

Systems with a wide amplitude range of input signals, i.e. distributed amplifiers, generally require some sort of gain control to maintain system linearity and sensitivity. Traditional solutions have relied on additional attenuation circuitry or external bypass switches that produce significant size, weight, and power costs. For example, adding a variable attenuator to the amplifier circuit is a typical solution to provide gain control. Alternatively, adding a bypass circuit to the amplifier will also provide gain control. However, both of these solutions require an additional component external to the amplifier that adds to chip area and contributes to other size, weight, and power costs. Additionally, the amplifier circuit is still receiving power when the output signal is externally attenuated. This leads to power inefficiencies. Linearity also suffers in the case of the external attenuator, as the non-linear amplifier component is still in the signal path.

SUMMARY OF THE INVENTION

An improved distributed amplifier is disclosed that overcomes the deficiencies in conventional distributed amplifiers discussed above. The improved distributed amplifier includes an input transmission line and an output transmission line with a number of active, parallel amplifier cells connected to the input transmission line and the output transmission line. The active amplifier cells collectively amplify the input signal from the input lead to produce an amplified output signal at the output lead. Additionally, a bypass switch is connected to the input and output transmission lines. The bypass switch is operative to convert either the input transmission line or the output transmission line into a bypass line creating a bypass path for the input signal to the output of the amplifier circuit.

BRIEF DESCRIPTION OF THE DRAWINGS

Embodiments will be described with reference to the following drawing figures, in which like numerals represent like items throughout the figures, and in which:

FIG. 5 is a plot of the gain on an output signal of an embodiment of a distributed amplifier that is turned on.

FIG. 7 is a plot of return loss for an embodiment of a distributed amplifier that is turned on.

DETAILED DESCRIPTION

The present invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

It should also be appreciated that the terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

The word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is if, X employs A; X employs B; or X employs both A and B, then "X employs A or B" is satisfied under any of the foregoing instances.

Further, unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
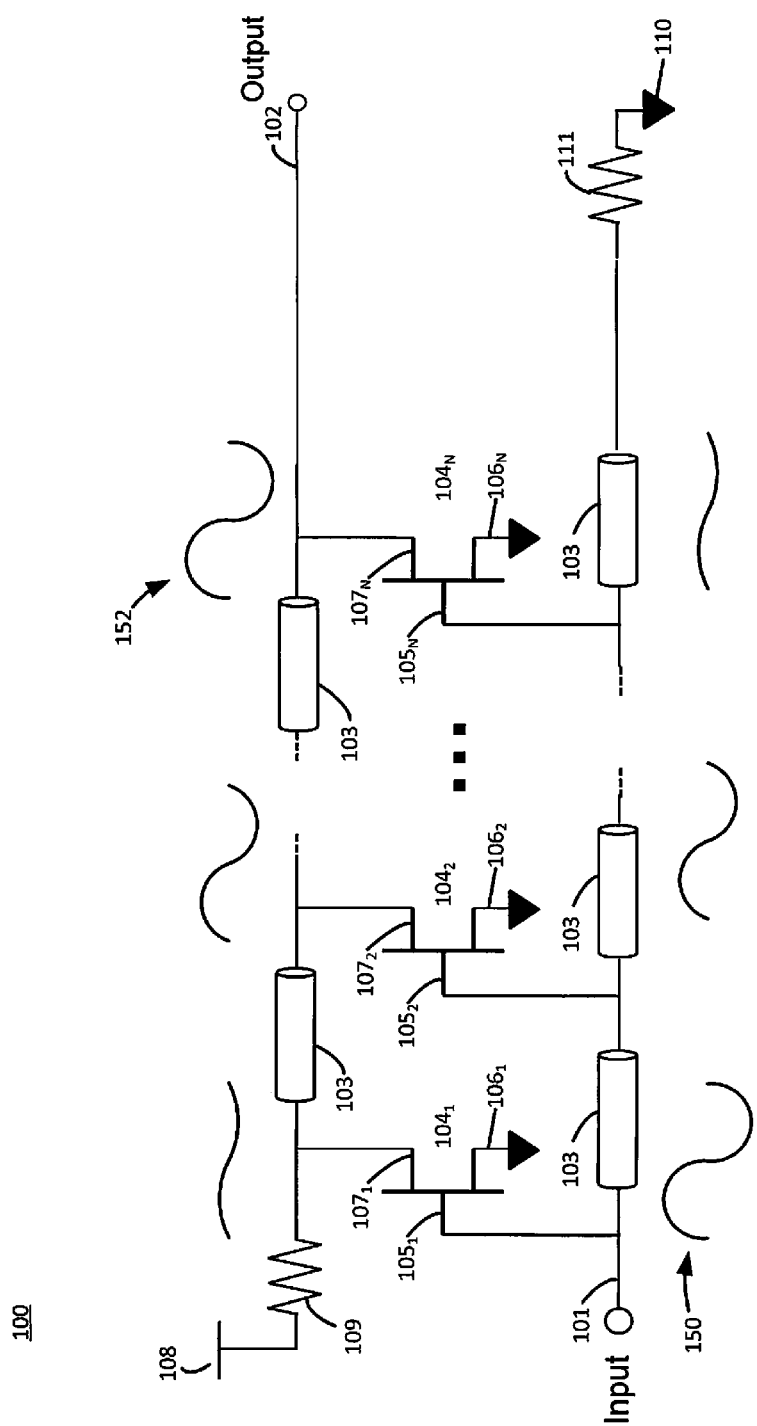
FIG. 1 is a diagram of a conventional distributed amplifier circuit.

Referring to FIG. 1, a schematic diagram of a traditional distributed amplifier 100 is provided. Distributed amplifier 100 includes input line 101 and output line 102. Schematic element 103 represents the inductive components of transmission lines. Active field effect transistor (FET) amplifier cells $104_1$, $104_2$, ..., $104_N$ connect the input line 101 and output line 102 in parallel. Each FET amplifier cell includes a source, drain, and gate. For example, FET amplifier cell $104_1$ includes a gate $105_1$, a source $106_1$, and a drain $107_1$. A radio frequency (RF) choked bias voltage source 108 provides bias voltage $V_{dd}$ to the drains $107_1$, $107_2$, ..., $107_N$ of active FET amplifier cell $104_1$, $104_2$, ..., $104_N$. Gate bias voltage is normally provided via gate side transmission line $105_1$, $105_2$, ..., $105_N$ (in parallel or series), but is excluded from the schematic shown in FIG. 1. As shown in FIG. 1, there is no direct connection between the input line 101 and the output line 102. Terminating resistors 109, 111 are provided to minimize signal reflections Finally, the input line 101 is terminated at ground 110.

Distributed amplifier 100 operates to amplify an input signal 150 as it propagates down input line 101. Each amplifier cell, e.g. FET amplifier cells $104_1$, $104_2$, through $104_N$, responds to the input signal 150 as it passes along input line 101 to induce a complimentary forward traveling signal in output line 102. After the signal passes the last amplifier cell, i.e. FET amplifier cell $104_N$, the signal is amplified and exits the distributed amplifier 100 as output signal 152. The primary advantage of distributed amplifiers is their capability to operate over a wide bandwidth.

The gain of the amplified signal is determined by the transconductance and bias point of a single active FET cell, but also has a linear dependence on the number of active FET cells in the distributed amplifier, limited by the parasitics of the real circuitry. Increasing the number of cells also increases the bandwidth of the amplifier, thus ultimately increasing the gain-bandwidth product of the amplifier within practical limitations due to parasitic effects of the FETs and the attached transmission lines. In some scenarios, distributed amplifier 100 is implemented on a monolithic microwave integrated circuit (MMIC). Since the MMIC that includes the distributed amplifier is small, there is an interest in keeping external circuitry to a minimum to improve size, weight and power efficiency. As a result, a method and mechanism for providing gain control in a distributed amplifier without adding external circuitry and contributing additional size, weight, and power costs is desired.

Figure 2:
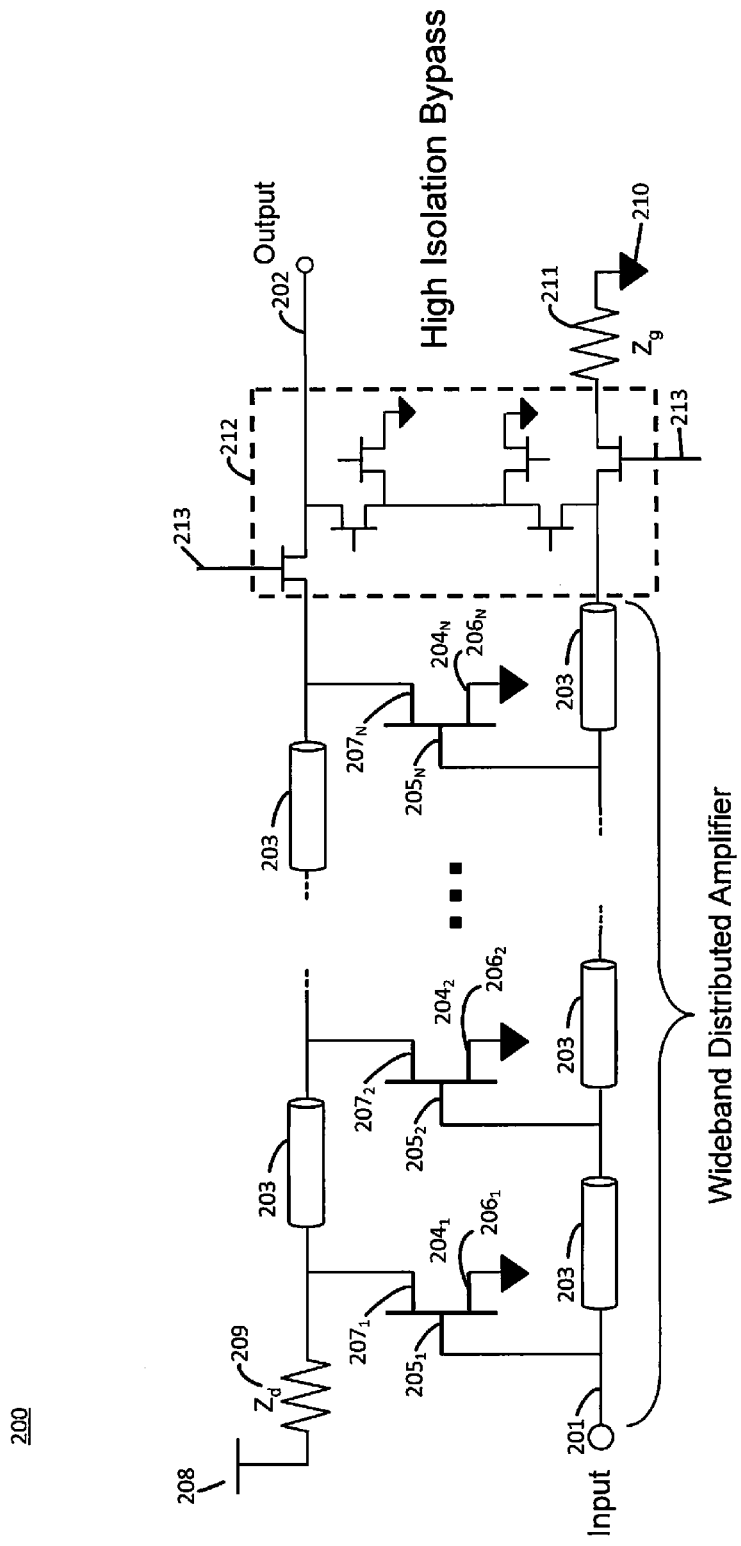
FIG. 2 is a diagram of an embodiment of a wideband distributed amplifier circuit with an integrated high isolation bypass.

Referring now to FIG. 2, a distributed amplifier 200 is shown that includes a high isolation bypass 212. Distributed amplifier 200 includes similar components to those of distributed amplifier 100. Distributed amplifier 200 includes input line 201 and output line 202. Schematic element 203 represents the inductive components of transmission lines. Active field effect transistor (FET) amplifier cells $204_1$, $204_2$, ..., $204_N$ connect the input line 201 and output line 202 in parallel. Each FET amplifier cell includes a source, drain, and gate. For example, FET amplifier circuit $204_1$ includes a gate $205_1$, a source $206_1$, and a drain $207_1$. An RF choked bias voltage source 208 provides bias voltage $V_{dd}$ to the active FET amplifier circuits $204_1$, $204_2$, ..., $204_N$. Terminating resistors 209, 211 are provided to minimize signal reflections that may damage the amplifier. Finally, the input line 201 is terminated at ground 210.

When distributed amplifier 200 is powered on, it operates substantially as described above with respect to distributed amplifier 100 of FIG. 1. As an input signal propagates through the input transmission line 201, the signal is amplified through each FET amplifier cell $204_1$, $204_2$, ..., $204_N$. Once the input signal travels through all amplifier cells, an amplified output signal is output from the amplifier on output line 202.

In contrast to a conventional distributed amplifier, e.g. distributed amplifier 100, the distributed amplifier 200 includes a high isolation bypass 212. The high isolation bypass 212 provides a direct communicative link from the input line 201 to the output line 202. Because the input and output lines of a distributed amplifier behave significantly as transmission lines, this configuration allows the input line 201 to act as a bypass transmission line to the output line 202, through the high isolation bypass 212. High isolation bypass 212 functions like a switch. When the high isolation bypass 212 is in its "ON" state, the input signal traveling through input line 201 is directly linked to the output line 202. When the high isolation bypass 212 is in its "OFF" state, the distributed amplifier 200 functions as a conventional distributed amplifier. Advantageously, the bypass is included within the amplifier integrated circuit without any additional, external components or circuitry. Additionally, other components may be included within the high isolation bypass 212, such as attenuators and equalizers, to tailor the output as needed.

The high isolation bypass 212 can be controlled using one or more control signals. For example, one scenario may include a control scheme where a particular voltage threshold on a control line enables the bypass 212 and simultaneously shuts off power to the distributed amplifier 200 resulting in increased efficiency. In the scenario illustrated in FIG. 2, a control signal may be introduced using connections 213. The control signal may be operative to enable or disable conductance through certain FETs. Details on operating the bypass will be discussed below in reference to FIG. 3.

In the scenario illustrated in FIG. 2, and described in greater detail below in reference to FIG. 3, the high isolation bypass 212 is shown as a switch circuit. In some scenarios, the distributed amplifier is packaged on a MMIC. Conventional solutions for gain control are not available because chip area on the MMIC is at a premium. For example, conventional bypass solution would require the addition of an external line, that bypasses the distributed amplifier. The external line has negative impacts to the overall size, weight, and power of the gain controlled amplifier circuit. For a conventional switched attenuator solution, external circuit is again required to attenuate the signal after it is output from the distributed amplifier. Adding this extra circuit, outside of the distributed amplifier, is not a desirable solution for performance or area. As shown in FIG. 2, the distributed amplifier 200 with high isolation bypass 212 does not require any external bypass line around the amplifier because the input line itself bypasses the active FETs $204_N$. Additionally, an external attenuator is not required for gain control because the high isolation bypass 212 provides adequate and effective gain control.

In some scenarios, the switch circuit may also include other components such as attenuator or equalizer circuitry without adding external circuitry or transmission lines on or around the MMIC. If an attenuator is included, the attenuator can attenuate all signals communicated from the input line 201 to the output line 202 when the switch is in its "ON" state. If equalizer circuitry is included, the equalizer circuitry can be configured to selectively attenuate different frequency bands within a signal communicated from the input line 201 to the output line 202 when the switch is in its "ON" state. For example, the equalizer can be configured to modify the signal so as to reduce any amplitude variations over a range of frequency components included within the signal. Such additions contribute only minimal additional circuitry internal to the distributed amplifier circuit on the MMIC itself, as shown in FIG. 3. One of skill in the art will recognize that the attenuator and equalizer may be added as desired in view the application for which the distributed amplifier will be put to use. They are not required for the operation of the high isolation bypass 212.

Figure 3:
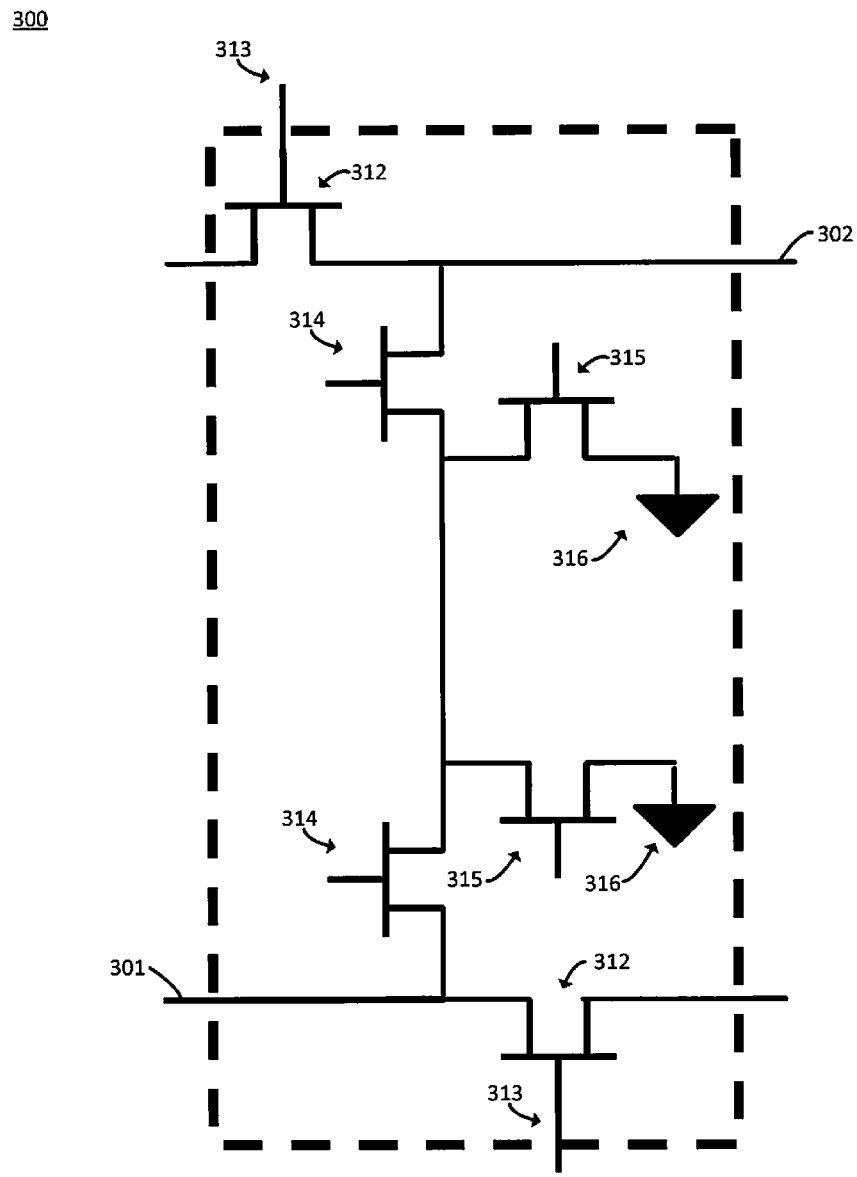
FIG. 3 is a diagram of an embodiment of an integrated bypass circuit.

Referring now to FIG. 3, a schematic diagram is provided that illustrates a particular scenario for a high isolation bypass 300. High isolation bypass 300 is essentially a switch that allows communication of an input signal on the input line 301 to the output line 302. Advantageously, the bypass line utilized by the high isolation bypass 300 is the input line of the amplifier.

In the scenario illustrated in FIG. 3, high isolation bypass 300 includes a plurality of FETs 312, 314, 315 and ground points 316. As mentioned above, control signals may be used to turn the bypass and/or the amplifier on and off. In the scenario illustrated in FIG. 3, FETs 312 are operative to simultaneously disconnect the distributed amplifier (not shown in FIG. 3) and connect the bypass circuit. For example, a control signal is introduced via connections 313 that cause FETs 312 to switch to their "OFF" state. Therefore, signals can no longer travel through input line 301 to the input load resistor and/or ground (e.g., load resistor 211 and ground 210 of FIG. 2). Similarly, an amplified signal can no longer travel through output line 302 to the output (not shown in FIG. 3). The same or a different control signal is used to turn on FETs 314, thereby enabling conductance through FETs 314, and forming a bypass path between input line 301 and output line 302. When FETs 312 are in their "OFF" state (i.e., open circuit) and FETs 314 are in their "ON" state "closed circuit", a direct transmission path is created between the input and the output lines 301, 302 of the amplifier. This condition creates a bypass around the FET amplifier cells forming the distributed amplifier. In some scenarios, the a bias voltage source 208 used for driving FET amplifier cells $204_1, 204_2, \ldots, 204_N$ can be switched to their "OFF" state to conserve power when the input signal is bypassed around the distributed amplifier.

When the bypass is not desired, FETs 312 are switched to their "ON" state (i.e., closed circuit) and FETs 314 are switched to their "OFF" state (i.e., open circuit). Therefore, the input line and output line are isolated and the distributed amplifier works substantially as described above. FETs 315 with grounds 316 are included in the particular scenario illustrated in FIG. 3 to provide additional isolation for the bypass. The FETs 315 can be controlled by the same or a different control signal that is used to control FETs 312, 314. In this scenario, FETs 315 are switched to their "ON" state, thereby connecting FETs 314 to ground 316 when the bypass is not desired. This action ensures that any current that is able to pass through FETs 314 when they are in their "OFF" state (open circuit) is routed to ground so that it does not reach the output line 302 through the bypass. Conversely, when FETs 314 are in their "ON" state (closed circuit) to enable the bypass as described above, FETs 315 are in their "OFF" state (open circuit) to prevent the input signal from being communicated to ground. FETs 315 and grounds 316 are not required for the operation of the bypass 300, and may be omitted if the extra isolation is not required for a specific application.

Figure 4:
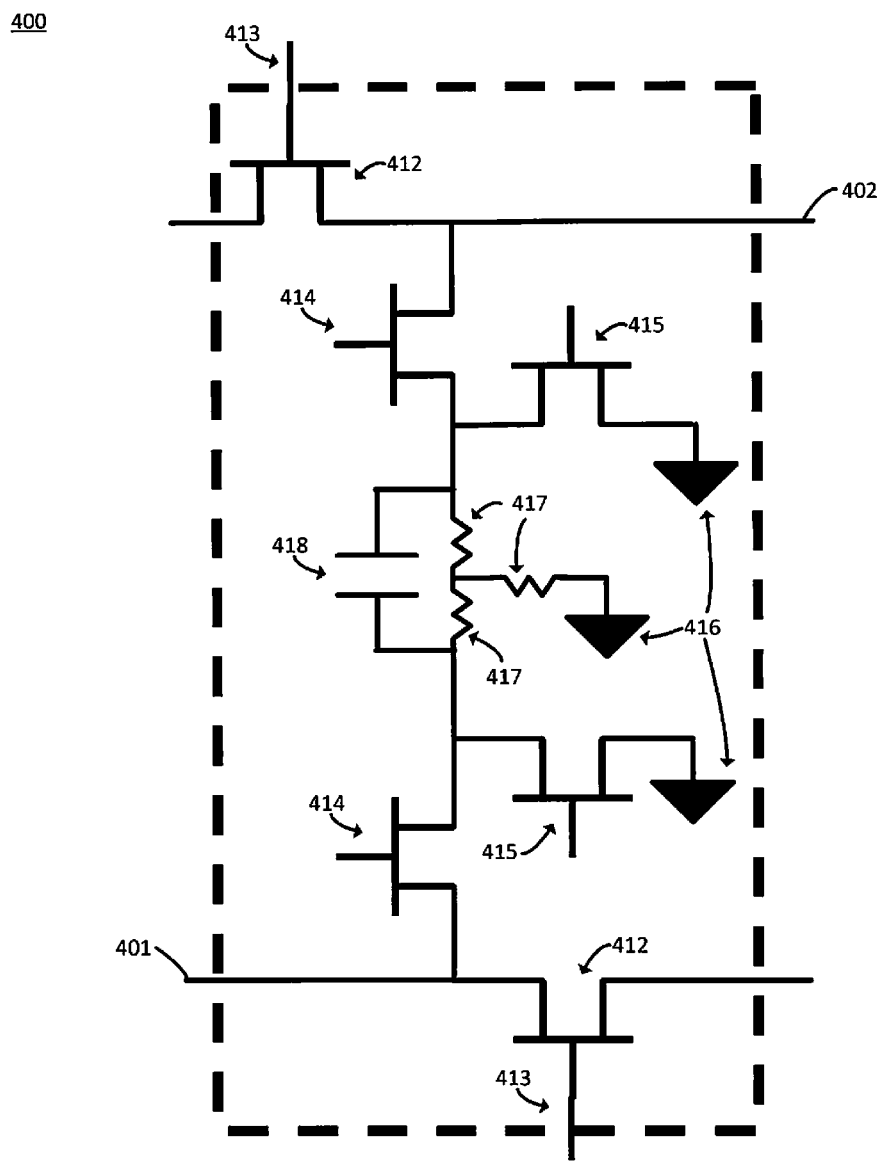
FIG. 4 is a diagram of an embodiment of an integrated bypass circuit

Referring now to FIG. 4, a schematic diagram is provided that illustrates another scenario for a high isolation bypass 400. In the scenario illustrated in FIG. 3, high isolation bypass 400 includes a plurality of FETs 412, 414, 415, grounds 416, a plurality of resistors 417, and a capacitor 418. The number of individual components included is a matter of implementation and can vary depending on the application for which the distributed amplifier and bypass are designed. The scenario illustrated in FIG. 4, for example, includes an equalizer and attenuator circuit (i.e., capacitor 418 providing a high pass filter and three resistors 417 providing a resistor network to form an attenuator). Accordingly, when the bypass is active signals communicated through the bypass will be attenuated and equalized. These additional components may be constructed within the high isolation bypass by adding only minimal additional circuitry (i.e. resistors 417 and capacitor 418) and without requiring external circuitry.

The operation of bypass 400 is similar to that of bypass 300 of FIG. 3. FETs 412 are in an on state (in which they form a closed circuit so as to conduct a flow of electricity between a source and drain) during the operation of the distributed amplifier. The FETs 412 are in an "OFF" state (in which they form an open circuit so as to prevent a flow of electricity between a source and drain) when the distributed amplifier is intended to be bypassed. As described above with respect to FIG. 3, the FETs 414 enable or disable the bypass path and FETs 415 provide additional isolation by draining any residual current from the bypass circuitry to grounds 416 when the bypass is disabled. FETs 412, 414, 415 may be controlled via suitable control signals applied to the gate terminal of each device.

One of skill in the art will recognize that the circuitry forming the bypass switch may include a variety of functions depending on the application for which the distributed amplifier is intended. For example, the bypass switch may form a radio detector circuit designed to retrieve information from a modulated radio signal or to determine the amplitude of the radio signal. Alternatively, the distributed amplifier circuit may form part of a filter circuit designed to perform various signal processing functions.

Figure 5:
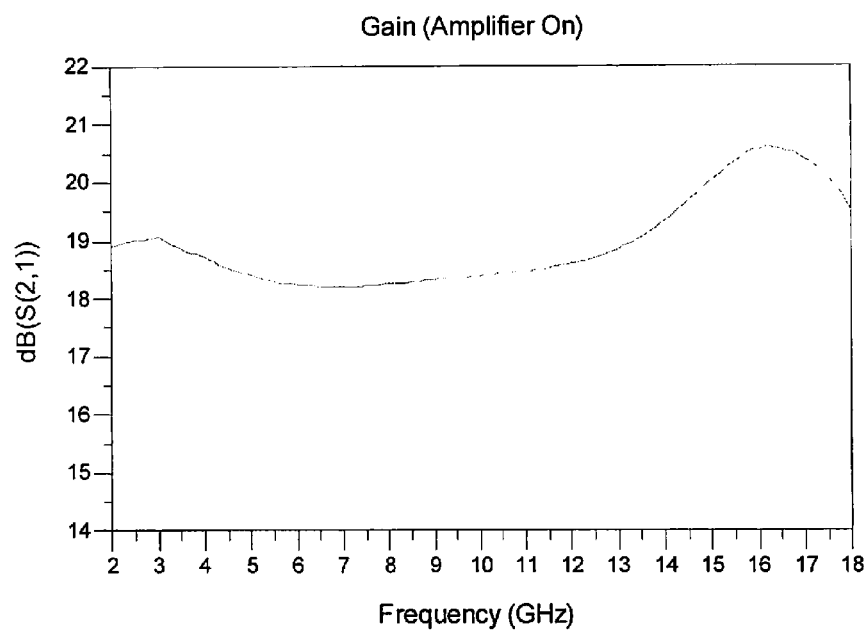
Figure 6:
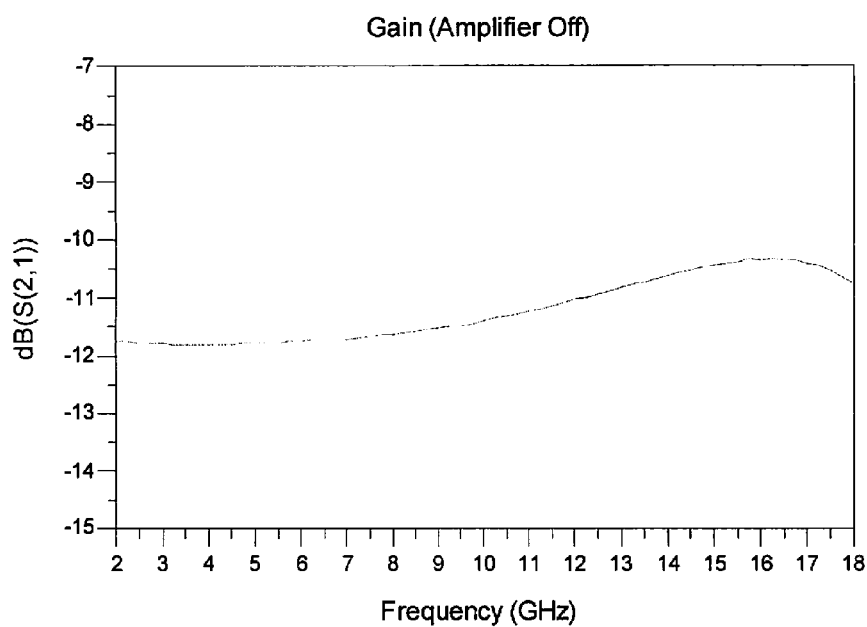
FIG. 6 is a plot of the gain on an output signal of an embodiment of a distributed amplifier that is bypassed.

Referring now to FIGS. 5 and 6, simulation plots are provided that illustrate the gain as a function of signal frequency as measured on the output of a distributed amplifier according to a particular scenario. In both FIGS. 5 and 6, the frequency range measured is from 2 GHz to 18 GHz. As shown in FIG. 5, the gain measured with the distributed amplifier turned on is between 18 and 20 dB of gain across a very wide range of frequencies, illustrating the good performance of the amplifier.

As shown in FIG. 6, across the same range of frequencies, the gain measured when the amplifier is bypassed is also substantially flat across the measured frequency range. The measured gain in FIG. 6 negative, indicating a loss. This loss measured in this particular scenario is present as a result of the attenuator circuit added into the bypass, e.g. the attenuator circuit added to the high isolation bypass (e.g., bypass 400 of FIG. 4). One skilled in the art will recognize that the excess loss beyond a typical transmission line loss shown in FIG. 6 is a result of the attenuator included in the bypass circuit. In the scenario shown in FIG. 6, the bypass and included attenuator shifts the usable dynamic range of the amplifier by 30 dB (i.e., the difference between the amplified signal and the bypassed signal is approximately 30 dB), thus resulting in higher power operating capability without signal degradation. Additionally, the effect of the attenuator on the signal creates the upward slope of the gain as a function of increased frequency shown in FIG. 6. In the case of a pure bypass (i.e. without any attenuation or equalization), the loss would be just that of the transmission line itself, approximately between zero and one (a gain between 0 and −1) in the case illustrated and would have a negative slope as a function of increased frequency.

Figure 7:
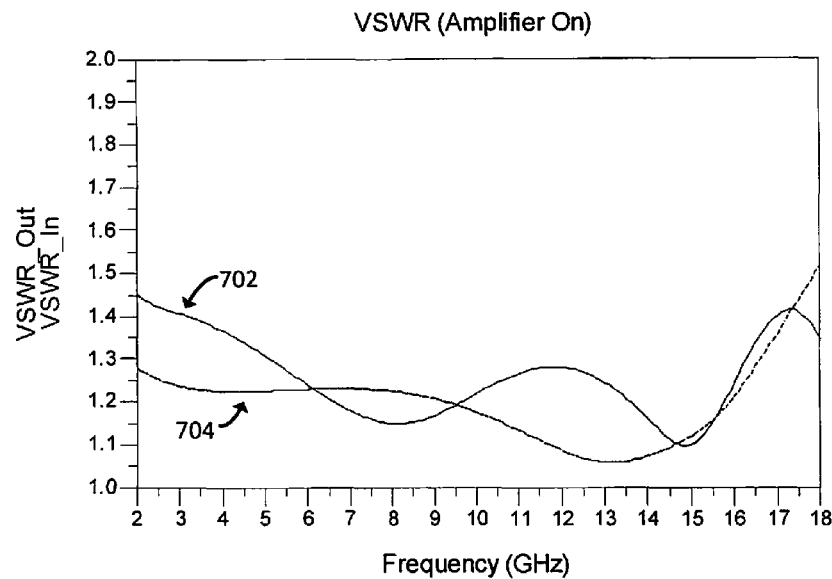
Figure 8:
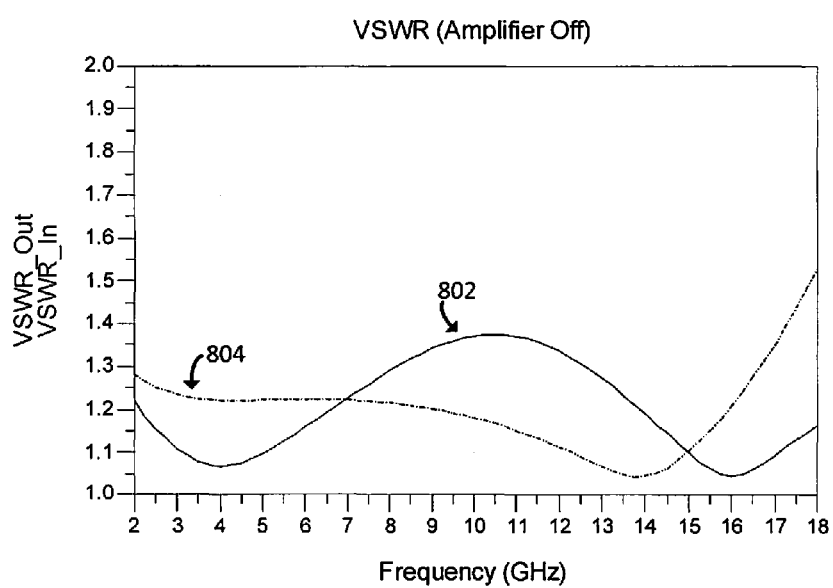
FIG. 8 is a plot of return loss for an embodiment of a distributed amplifier that is bypassed.

Referring now to FIGS. 7 and 8, simulation plots are provided that illustrate the input and output voltage standing wave ratio (VSWR) performance of the distributed amplifier. In the scenario shown in FIG. 7, with the amplifier powered on, the VSWR remains below 1.5:1, indicating a wellmatched amplifier. Plot 702 is the VSWR at the input of the amplifier. Plot 704 is the VSWR at the output of the amplifier. Similarly, in FIG. 8, with the amplifier powered off (i.e. bypassed), the VSWR is also below 1.5:1. Plot 802 is the VSWR at the input of the amplifier. Plot 804 is the VSWR at the output of the amplifier. The VSWR illustrated in FIGS. 7 and 8 demonstrates that the high isolation bypass does not significantly degrade the performance of the distributed amplifier circuit, either when it is on or when it is bypassed.

One of skill in the art will recognize that the linearity of the bypassed amplifier will be much higher than that of an attenuated amplifier. Because the bypass path does not require signal propagation through the non-linear FET cells, signal degradation due to self-modulation and inter-modulation does not occur. Although this advantage may also be obtained by using an external bypass circuit, the internal bypass described herein may be implemented without additional size, power, and weight costs. In the conventional case of a successive external attenuator in the cascade, the signal would still be degraded by the amplifier, thus reducing the overall dynamic range of the circuit.

Although the invention has been illustrated and described with respect to one or more implementations and/or scenarios, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

We claim:

1. A distributed amplifier integrated circuit (DAIC) comprising:
   an input transmission line terminated on an input side of the DAIC with an input lead configured to accept an input signal;
   an output transmission line terminated on an output side of the DAIC with an output lead configured to output an output signal;
   a plurality of parallel amplifier cells connected to the input transmission line and the output transmission line that collectively amplify the input signal from the input lead to produce an amplified output signal at the output lead; and
   a bypass switch connecting the input transmission line with the output transmission line, the switch operative to convert one of the input transmission line and the output transmission line into a bypass line configured to bypass the plurality of parallel amplifier cells and provide a direct path between said input transmission line and said output transmission line to produce a bypassed output signal at the output lead.

2. The DAIC of claim 1, wherein the bypass switch connects the input transmission line and the output transmission line at an output side of the amplifier, and the input transmission line is converted into the bypass line.

3. The DAIC of claim 1, wherein the bypass switch connects the input transmission line and the output transmission line at an input side of the amplifier, and the output transmission line is converted into the bypass line.

4. The DAIC of claim 1 wherein each of the plurality of amplifier cells comprising an amplifier field effect transistor (FET) that includes a gate, source, and a drain.

5. The DAIC of claim 1, wherein the bypass switch comprises a plurality of switch FETs, each including a gate, a source, and a drain.

6. The DAIC of claim 5, wherein the bypass switch further comprises:
   a first FET of the plurality of switch FETs that is connected to the input transmission line; and
   a second FET of the plurality of switch FETs that is connected to the output transmission line;
   wherein the first FET is connected to the second FET to form a bypass path between the input transmission line and the output transmission line when the first and second FETs are in an on state.

7. The DAIC of claim 6, wherein the bypass switch further comprises:
   a third FET of the plurality of switch FETs that is connected to the first FET and placed in series between the first FET and a first terminating resistor; and
   a fourth FET of the plurality of switch FETs that is connected to the second FET and placed in series between the second FET and a second terminating resistor,
   wherein the third and fourth FETs are operative to isolate the bypass path when the third and fourth FETs are in an off state.

8. The DAIC of claim 7, wherein the bypass switch further comprises an attenuator circuit reduce the level of the input signal a predetermined amount.

9. The DAIC of claim 1, wherein the bypass switch further comprises an equalizer.

10. The DAIC of claim 1, wherein the bypass switch further comprises a power detector circuit.

11. The DAIC of claim 1, wherein the bypass switch further comprises a filter circuit.

12. A distributed amplifier comprising:
   an input transmission line including an input lead configured to accept an input signal;
   an output transmission line including an output lead configured to output an amplified signal;
   a plurality of parallel amplifier cells connected to the input transmission line and the output transmission line that collectively amplify the input signal from the input lead to produce the amplified signal at the output lead; and
   a bypass switch connecting the input transmission line with the output transmission line, the bypass switch operative to provide a direct path between said input transmission line and said output transmission line to produce a bypassed signal at the output lead, wherein the bypassed signal is an unamplified input signal.

13. The distributed amplifier of claim 12, further comprising:
   a first transistor connecting the input transmission line with the bypass switch;
   a second transistor connecting the output transmission line with the bypass switch; and
   a bypass line connecting the first and second transistors, wherein current is able to flow freely from the input transmission line to the output transmission line through the bypass line when the first and second transistors are in an on state.

14. The distributed amplifier of claim 13, further comprising:
   a third transistor connected to the input transmission line; and a fourth transistor connected to the output transmission line,
  wherein the third and fourth transistors are in an off state when the first and second transistors are in an on state.

15. The distributed amplifier of claim 14, further comprising a fifth transistor connected to the bypass line, wherein the fifth transistor grounds the bypass line when the first and second transistors are in an off state.

\* \* \* \* \*